(12) United States Patent
Rosenberg et al.

(10) Patent No.: US 11,199,673 B2
(45) Date of Patent: Dec. 14, 2021

(54) OPTOELECTRONIC DEVICE WITH INTEGRATED UNDERFILL EXCLUSION STRUCTURE

(71) Applicant: Hewlett Packard Enterprise Development LP, Houston, TX (US)

(72) Inventors: Paul Kessler Rosenberg, Sunnyvale, CA (US); Geza Kurczveil, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 66 days.

(21) Appl. No.: 16/528,182

(22) Filed: Jul. 31, 2019

(65) Prior Publication Data
US 2021/0033807 A1 Feb. 4, 2021

(51) Int. Cl.
*H01L 21/56* (2006.01)
*G02B 6/43* (2006.01)
*G02B 6/42* (2006.01)

(52) U.S. Cl.
CPC ............. *G02B 6/43* (2013.01); *G02B 6/4212* (2013.01); *H01L 21/563* (2013.01)

(58) Field of Classification Search
CPC .................................................... H01L 21/563
See application file for complete search history.

(56) References Cited

U.S. PATENT DOCUMENTS 6,661,939 B2    12/2003  Kaneko et al.
6,907,151 B2 *   6/2005  Yunus ................. G02B 6/4214
                                                        385/14
10,811,279 B2 * 10/2020  Pelletier ................. H01L 24/17
2004/0118599 A1*  6/2004  Chason .................... H01L 24/17
                                                         174/260
2009/0180732 A1   7/2009  Takai et al.
(Continued)

FOREIGN PATENT DOCUMENTS

JP      2009021430 A  *  1/2009

OTHER PUBLICATIONS

Miura, T. et al.; "Hollow Optical Waveguide for Temperature-insensitive Photonic Integrated Circuits"; available online at <https://iopscience.iop.org/article/10.1143/JJAP.40.L688/pdf>, May 15, 2001; 2 pages.

*Primary Examiner* — Charlie Y Peng
(74) *Attorney, Agent, or Firm* — Hewlett Packard Enterprise

(57) ABSTRACT

Examples herein relate to optoelectronic systems or modules. In particular, implementations herein relate to an optoelectronic module or system that includes a substrate having opposing first and second sides and an optoelectronic component having opposing first and second sides flip chip assembled to the substrate. The optoelectronic component is configured to emit at least one optical signal to the substrate, receive at least one optical signal from the substrate, or both. The optoelectronic system further includes an underfill exclusion structure configured to prevent underfill material dispensed between the optoelectronic component and the substrate from flowing into an optical area or path of the at least one optical signal transmitted between the optoelectronic component and the substrate. The underfill exclusion structure is spaced apart from at least one of the optoelectronic component or the substrate.

12 Claims, 6 Drawing Sheets

(56) References Cited

U.S. PATENT DOCUMENTS

| | | | |
|---|---|---|---|
| 2009/0267213 A1* | 10/2009 | Lin | H01L 23/49816 257/687 |
| 2014/0328596 A1 | 11/2014 | Mathai et al. | |
| 2017/0261693 A1 | 9/2017 | Gambino et al. | |

* cited by examiner

OPTOELECTRONIC DEVICE WITH INTEGRATED UNDERFILL EXCLUSION STRUCTURE

BACKGROUND

Optoelectronic communication (e.g., using optical signals to transmit data) is becoming more prevalent as a potential solution, at least in part, to the ever increasing demand for high bandwidth, high quality, and low power consumption data transfer in applications such as high performance computing systems, large capacity data storage servers, and network devices. Optoelectronic systems including silicon photonics systems that include optical components integrated with silicon substrates are being developed to meet this demand.

BRIEF DESCRIPTION OF THE DRAWINGS

Certain examples are described in the following detailed description and in reference to the drawings, in which.

DETAILED DESCRIPTION OF SPECIFIC EXAMPLES

Figure 1A:
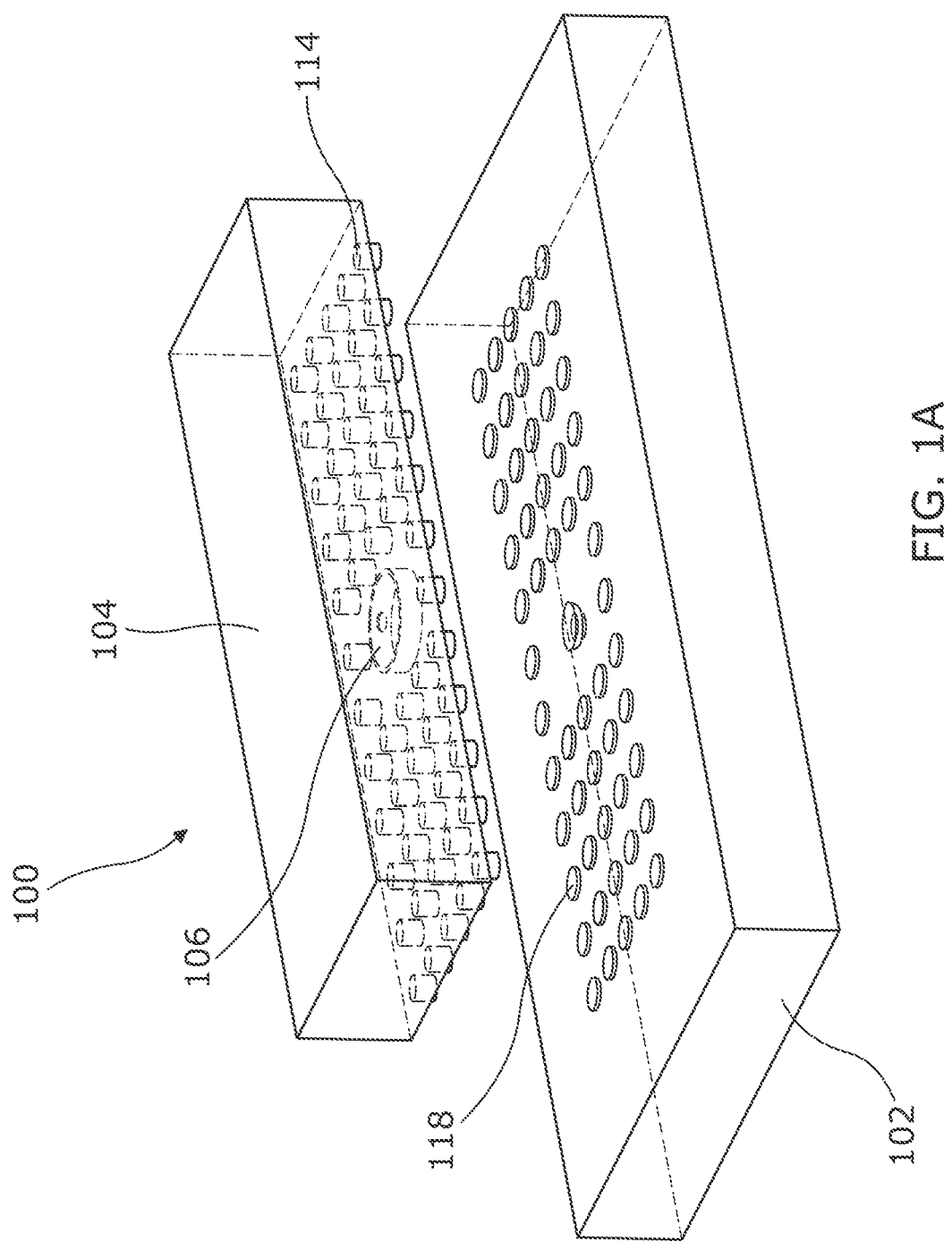
FIG. 1A illustrates an exploded view of an optoelectronic component and substrate of an example optoelectronic system including an integrated underfill exclusion structure according to the present disclosure.
Figure 1B:
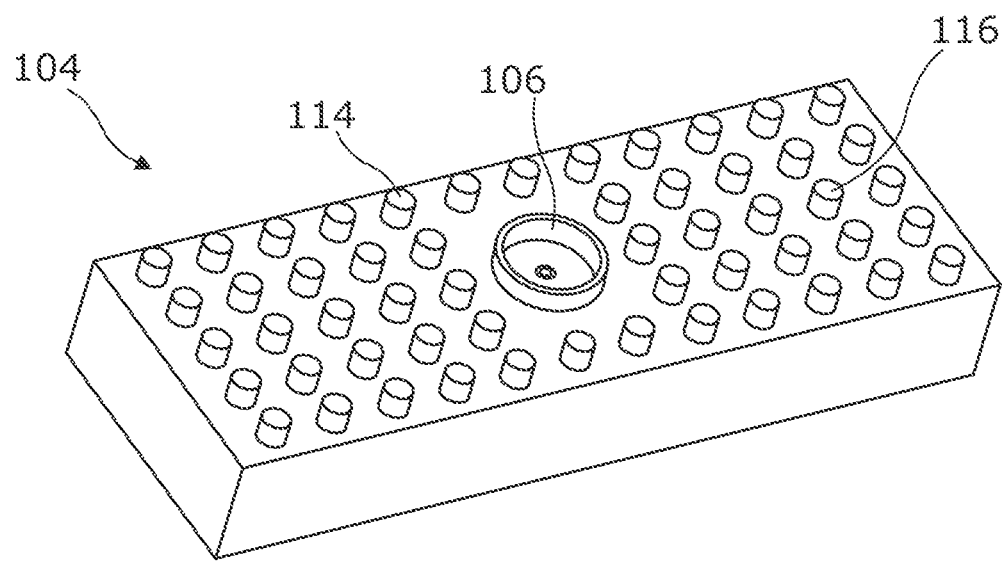
FIGS. 1B-1C illustrate bottom and top perspective views of the optoelectronic component and substrate, respectively, of the optoelectronic system of FIG. 1A.
Figure 1C:
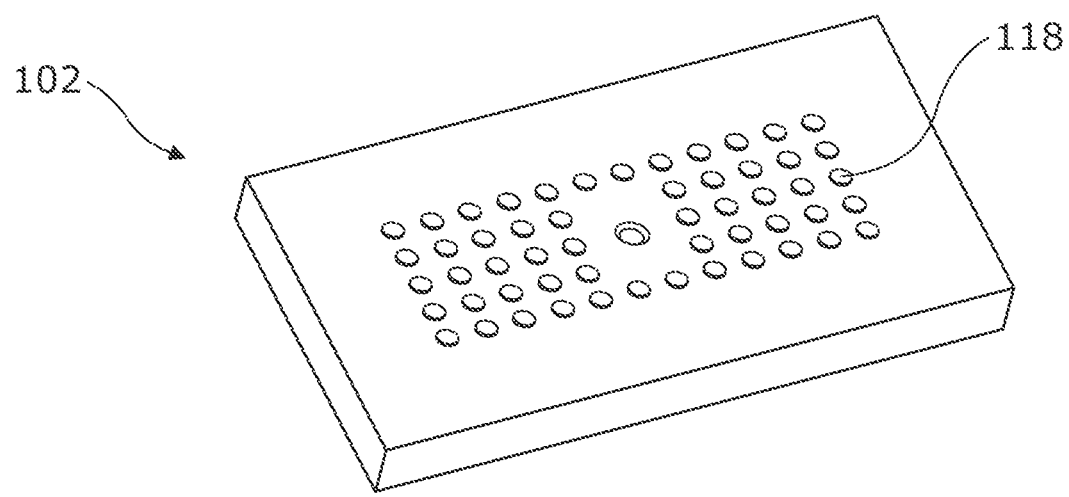
Figure 1D:
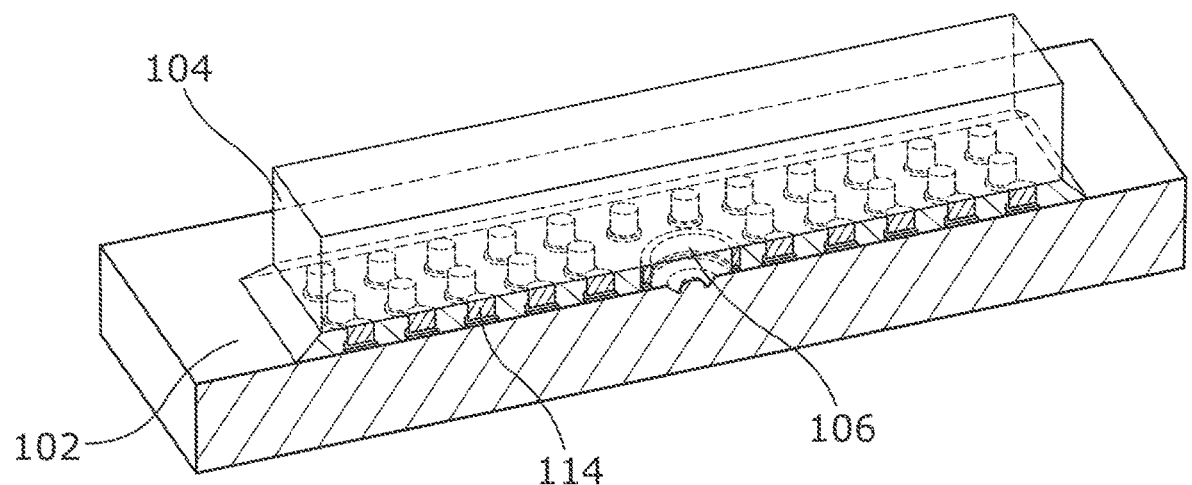
FIG. 1D illustrates a section view of the optoelectronic system of FIG. 1A with the optoelectronic component flip chip assembled to the substrate.
Figure 1E:
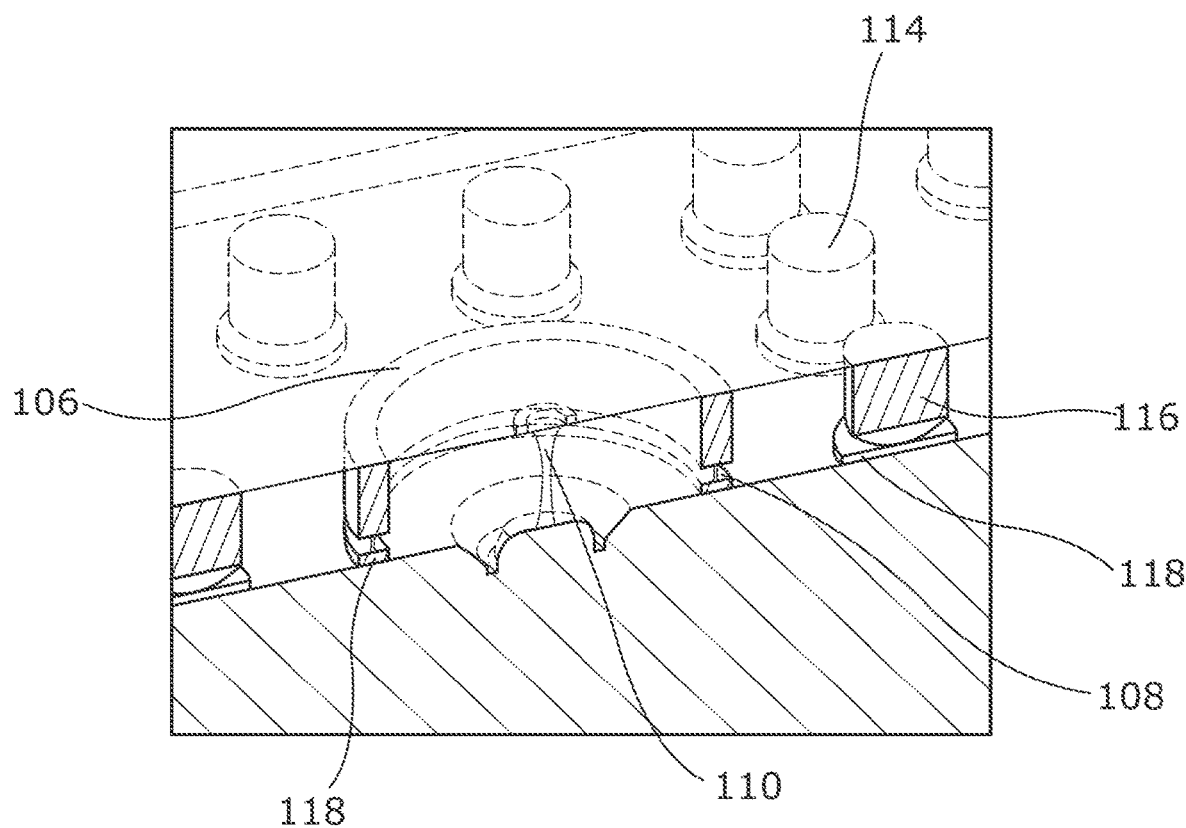
FIG. 1E illustrates a close-up view of the underfill exclusion structure of FIG. 1D.

The present disclosure describes various examples of an optoelectronic system or module that includes an integrated underfill exclusion structure. The optoelectronic system includes an optoelectronic component flip chip assembled to a substrate. Such optoelectronic systems can include silicon photonics (SiPh) systems. SiPh systems include for example, unpowered "passive" optical components such as grating couplers and waveguides, and electronically powered "active" devices such as light sources or photodetectors that can be integrated with silicon (Si) substrates. Integration may involve growing such optical devices or components onto or within a Si wafer or substrate. Another commonly known integration method involves flip chip assembly.

Flip chip assembly refers to bonding or otherwise coupling two components together (e.g., the optical component or chip and the substrate) by melting small amounts of solder (e.g., a solder reflow process) that have been applied to or otherwise deposited on the optical component, substrate, or both. Metal pillars or posts with solder-coated tips can be used in place of or in addition to solder alone. This can create an improved solder bump geometry relative to just solder, because the metal pillars can be fabricated with smaller feature size, thereby providing a larger relative number of electrically unique connections within a given area. Typically, after the components have been soldered together, a layer of underfill material or adhesive is dispensed between the flip chip assembled components.

The underfill material or underfill layer is dispensed and cured in spaces between the optoelectronic component and the substrate and around solder joints or connections coupling the optoelectronic component and the substrate. The underfill material can provide mechanical support such that the solder joints or connections do not have to withstand on their own all the stresses or forces such solder joints or connections undergo during a lifetime of the flip chip assembled device. For example, the underfill material can reduce stress on the solder joints or connections that may arise as a result of differences in the coefficients of thermal expansion between the optoelectronic component and the substrate. Additionally, the underfill material can reduce movement between the optoelectronic component and the substrate which can result in misalignment.

However, the presence of such underfill material may cause certain issues with respect to an optoelectronic system where optical signals are being transmitted between flip chip assembled components. If allowed to flow into the optical transmission area or path or not properly selected, the underfill material may interfere with optical transmission between the substrate and flip chip assembled optoelectronic component of the optoelectronic system. For example, there is a risk that such underfill material can absorb light, reducing signal strength and overall system performance.

Underfill materials are typically selected or chosen for particular characteristics, such as good flow properties or thermal expansion matched to the flip chip assembled components. Because the underfill material flows into the optical transmission path or area, underfill material used in optical applications is also typically transparent which limits the range of materials that can be used as the underfill material or layer in optoelectronic systems. Further, high levels of irradiance can cause the underfill material to yellow and become more opaque over time such that it absorbs more light with continued use. This can lead to a negative feedback loop wherein ever increasing amounts of the optically transmitted signal is absorbed by the underfill, ultimately resulting in burning of the underfill material and failure of the optoelectronic system or component.

Therefore, there remains a need for improved underfill exclusion structures to prevent the underfill material from flowing into an optical path or area between flip chip assembled components. This can reduce the issues or problems described above as well as expand the range of materials that can be selected or used as the underfill material in such systems. In accordance with the various examples described herein, optoelectronic systems or modules are provided that include improved underfill exclusion structures.

With respect to FIGS. 1A-1F together, an example of an optoelectronic module or system 100 is illustrated according to the present disclosure. The optoelectronic system 100 includes a substrate 102 having opposing first and second sides. The optoelectronic system 100 includes an optoelectronic component 104 having opposing first and second sides flip chip assembled to the first side (e.g., top side) of the substrate 102. The optoelectronic component 104 is configured to emit at least one optical signal to the substrate, receive at least one optical signal from the substrate, or both.

The optoelectronic system 100 includes an underfill exclusion structure 106 configured to prevent underfill material 108 dispensed between the optoelectronic component 104 and the substrate 102 from flowing into an optical area or path 110 of the at least one optical signal transmitted between the optoelectronic component 104 and the substrate 102 (e.g., between corresponding optical elements of the optoelectronic component 104 and the substrate 102, respectively). The underfill exclusion structure 106 is spaced apart from at least one of the optoelectronic component 104 or the substrate 102. For example, the underfill exclusion structure 106 is formed on and extends from the optoelectronic component 104 towards the substrate 102, but is spaced apart from the substrate 102 by a gap G. The gap G between the substrate 102 and the underfill exclusion structure 106 is sized such that the underfill material 108 is prevented from flowing into the optical path 110 of the at least one optical signal transmitted between the optoelectronic component 104 and the substrate 102 via capillary action.

Figure 1F:
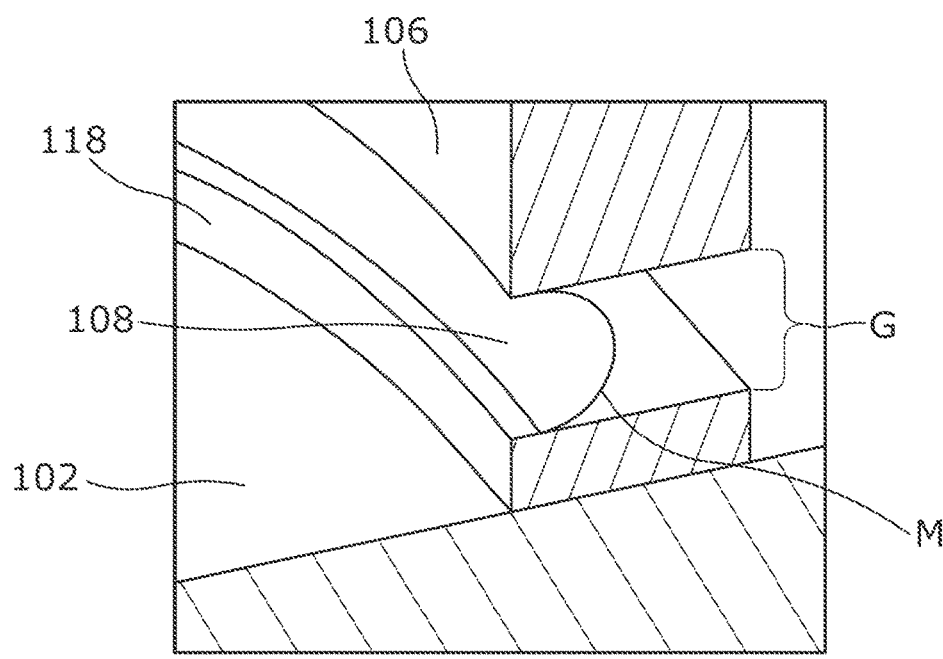
FIG. 1F is a close-up view of a portion of the underfill exclusion structure of FIG. 1E.

With reference to FIG. 1F, the gap G between the substrate 102 and the underfill exclusion structure 106 has a sufficient height or width (e.g., correlated or based on chemical composition or flow characteristics of the selected underfill material 108 as well as the underfill exclusion structure 106) such that the underfill material 108 is prevented from flowing past the underfill exclusion structure 106 and into the optical path 110 via capillary action. For example, the gap G is sized such that flow of the underfill material 108 via capillary action is prevented at or within the gap G (e.g., steady state is reached between cohesion of molecules of the underfill material 108 and adhesion of the underfill material 108 to the underfill exclusion structure 106). As illustrated, a meniscus M representing an end of the flow of the underfill material 108 via capillary action is formed at or under the underfill exclusion structure 106 (e.g., between the underfill exclusion structure 106 and a corresponding pad on the substrate 102). In other words, flow of the underfill material 108 is shut-off (e.g., prevented by the capillary action between the underfill material 108 and the gap G, from exiting or flowing past the gap and into the optical path 110 of the optical signal).

As such, the underfill material 108 does not interfere with the at least one optical signal transmitted between the substrate 102 and optoelectronic component 104. This reduces or eliminates risk of the underfill material 108 absorbing light from the at least one optical signal and negatively impacting performance of the optoelectronic system 100. Additionally, different or more materials can be used as the underfill material 108 (e.g., non-transparent or opaque materials).

While illustrated in FIGS. 1A-1F as being spaced apart from the substrate 102, in other examples, the underfill exclusion structure 106 can be formed on and extend from the substrate 102 towards the optoelectronic component 104, but is spaced apart from the optoelectronic component 104 by a gap. The gap between the optoelectronic component 104 and the underfill exclusion structure 106 is sized such that the underfill material 108 is prevented from flowing into the optical path 110 of the at least one optical signal transmitted between the optoelectronic component 104 and the substrate 102 via capillary action as described above.

In yet other examples, the underfill exclusion structure 106 can include first and second portions spaced apart by a gap. The first portion can be formed on and extend from the substrate 102 towards the optoelectronic component 104. The second portion can be formed on and extend from the optoelectronic component 104 towards the substrate 102. End portions of the first and second portions facing each other can be spaced apart by the gap. As described above, the gap between the first and second portions can be sized such that the underfill material is prevented from flowing into the optical path 110 of the at least one optical signal transmitted between the optoelectronic component 104 and the substrate 102 via capillary action.

Additionally, by providing a gap between the underfill exclusion structure 106 and the substrate 102, optoelectronic component 104, or first and second portions formed on the substrate 102 and the optoelectronic component 104, respectively, as described herein, process flow or fabrication steps can also be improved. For example, because the underfill exclusion structure 106 is designed to be spaced apart from the substrate 102, optoelectronic component 104, or both with a gap, the need to fabricate the underfill exclusion structure 106 with precise dimensions is reduced because it does not need to extend completely between the substrate 102 and the optoelectronic component 104. Additionally, fabrication steps can also be reduced or minimized as adhesive or some other bonding step is not required to couple the underfill exclusion structure 106 to both the optoelectronic component 104 and the substrate 102.

Figure 1G:
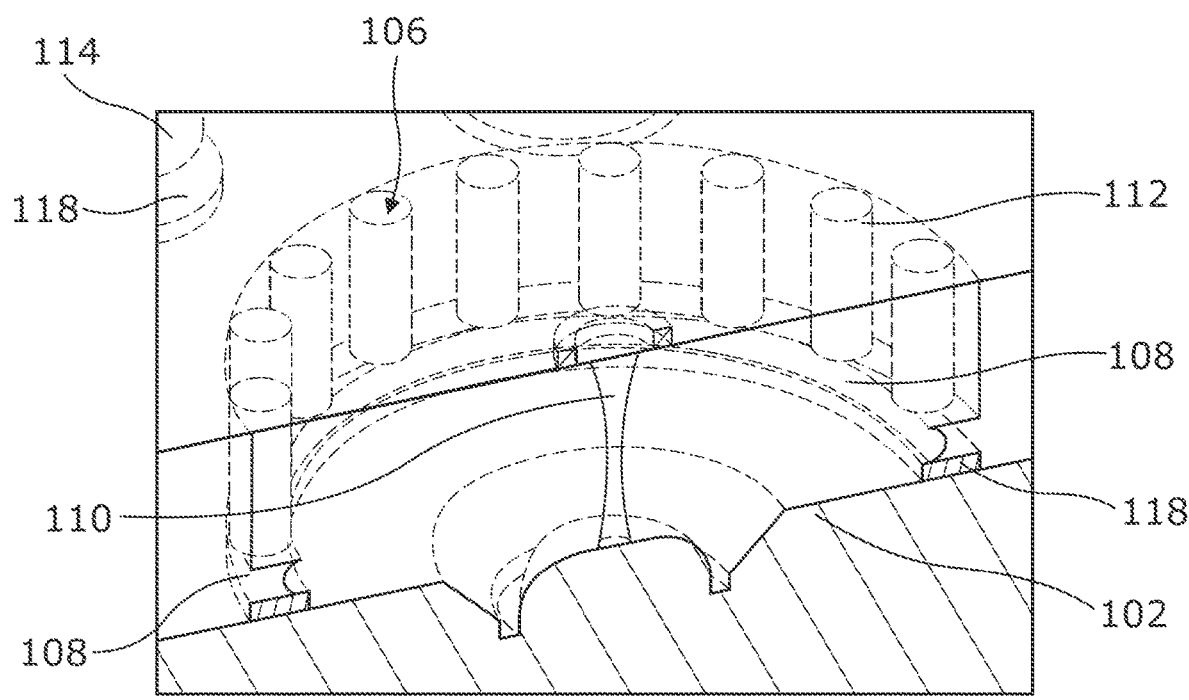
FIG. 1G illustrates a sectional close-up view of another example of an underfill exclusion structure that can be integrated with the optoelectronic system of FIG. 1A according to the present disclosure and FIG. 1H is a close-up view of a portion of the underfill exclusion structure of FIG. 1G.
Figure 1H:
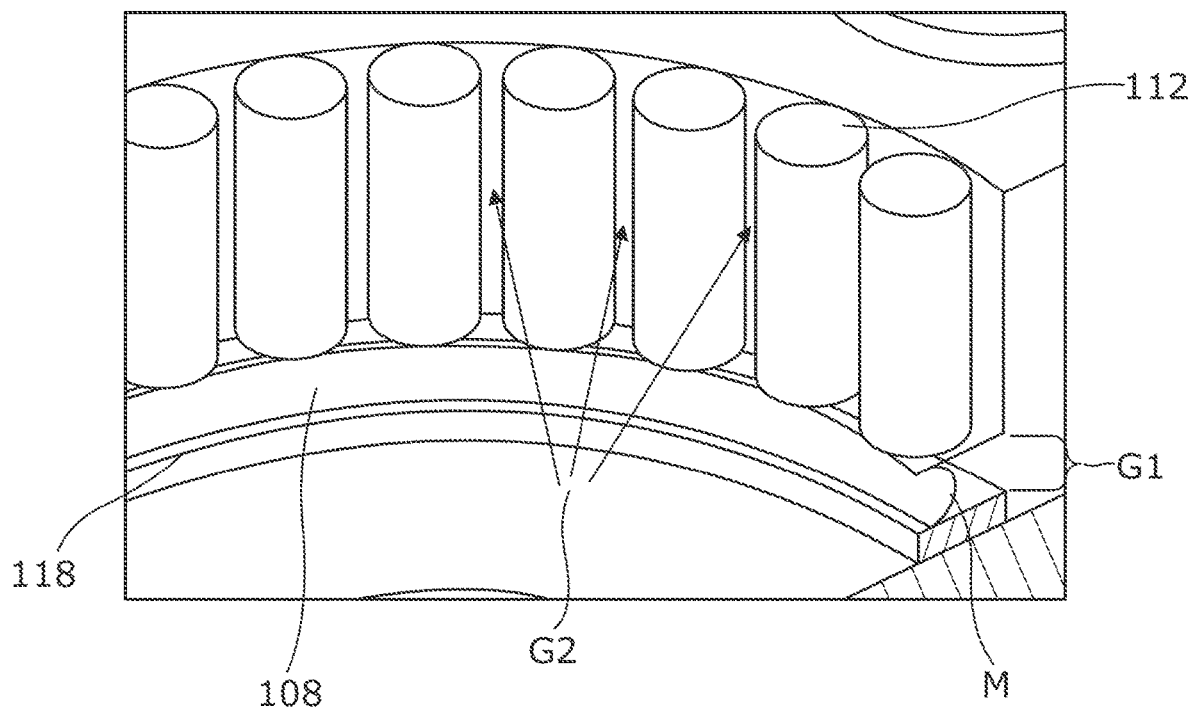

As illustrated in FIGS. 1A-1F, the underfill exclusion structure 106 can be formed or constructed as a continuous wall spaced from and extending around the optical path 110 of the at least one optical signal transmitted between the optoelectronic component 104 and the substrate 102. While illustrated as having a circular or ring cross-sectional configuration, the wall can have a rectangular or other suitable cross-sectional configuration as well. In yet other examples, as illustrated in FIGS. 1G-1H, the underfill exclusion structure 106 can be formed or constructed as a plurality of pillars or posts 112 in place of a continuous wall. The plurality of pillars 112 are spaced from and extend around the optical path 110 of the at least one optical signal transmitted between the optoelectronic component 104 and the substrate 102.

As described above with respect to the wall, the plurality of posts 112 can extend around the optical path 110 of the at least one optical signal transmitted between the optoelectronic component 104 and the substrate 102 in a circular, rectangular, or other suitable cross-sectional configuration. The plurality of posts 112 can also be spaced from the substrate 102, the optoelectronic component 104, or include first and second portions spaced apart, by a gap G1 (e.g., similar or identical to gap G of the example underfill exclusion structure 106 of FIGS. 1A-1F). The gap G1 can function in the same manner as gap G (e.g., to shut-off or prevent underfill material from flowing past the gap and into the optical path 110 of the optical signal). Additionally, the plurality of pillars 112 also are spaced apart from each other by gaps G2. The gaps G2 can also be sized such that flow of the underfill material 108 via capillary action is prevented at or within the gaps G2 from flowing into the optical path 110 of the optical signal. In other examples, the gaps G2 are sufficiently small such that underfill material 108 is prevented from entering the gaps G2.

The optoelectronic system 100 can include a plurality of pillars 114 coupling the first side of the substrate 102 and the optoelectronic component 104 to flip-chip assemble the optoelectronic component 104 to the substrate 102. The plurality of pillars 114 can be made of the same material (e.g., copper or other metal) or a different material as the underfill exclusion structure 106. The plurality of pillars 114 can include solder-coated tips 116 such that the optoelectronic component 104 can be soldered to the substrate 102.

In some examples, the plurality of pillars 114 can be replaced by solder or solder balls alone. Similarly, the underfill exclusion structure 106 can be constructed from solder or an annulus of solder. The optoelectronic system 100 can also include a plurality of metallized pads 118 on the substrate 102 corresponding to the pillars 114 and the underfill exclusion structure 106. The pillars 114 can be soldered to the pads 118 for flip chip attachment of the optoelectronic component 104 thereto and forming electrical interconnects. When the optoelectronic system 100 includes corresponding pad(s) 118 on the substrate 102 for the underfill exclusion structure 106, the gap G (or G1 in the example of FIGS. 1G-1H) extends between the pad(s) 118 and the underside of the underfill exclusion structure 106.

The optoelectronic component 104 as described herein can include or form part of an optical transmitter, an optical receiver, or optical transceiver. For example, the optoelectronic component 104 can include one or more laser sources to emit an optical signal, photodetectors to receive an optical signal, or both. In some examples, the optoelectronic component 104 can includes one or more lenses to emit or receive an optical signal.

As described herein, the substrate 102 can refer to an organic build-up substrate, silicon or ceramic substrate, an interposer (e.g., an Si-interposer), integrated circuit (e.g., ASIC), chip, die, or printed circuit board depending on the application. The substrate can further include electrically conductive traces or vias to pass electrical signals to or from the electrical interconnects to an integrated circuit (e.g., an ASIC, driver integrated circuit, receiver integrated circuit) for driving laser sources or processing electrical signals converted by photodetectors. In some example, the substrate can be constructed of glass or other suitable materials with a relatively high-index of refraction (e.g., GaAs, GaP, GaN, InP).

In some examples, wherein two or more optical signals are transmitted between the optoelectronic component 104 and the substrate 102 (e.g., the optoelectronic component 104 includes two or more laser sources), the underfill exclusion structure 106 is configured to prevent the underfill material 108 dispensed between the optoelectronic component 104 and the substrate 102 from flowing into the optical paths of the two or more optical signals. As such, the underfill exclusion structure 106 extends around and is spaced from the two or more optical paths.

Figure 2:
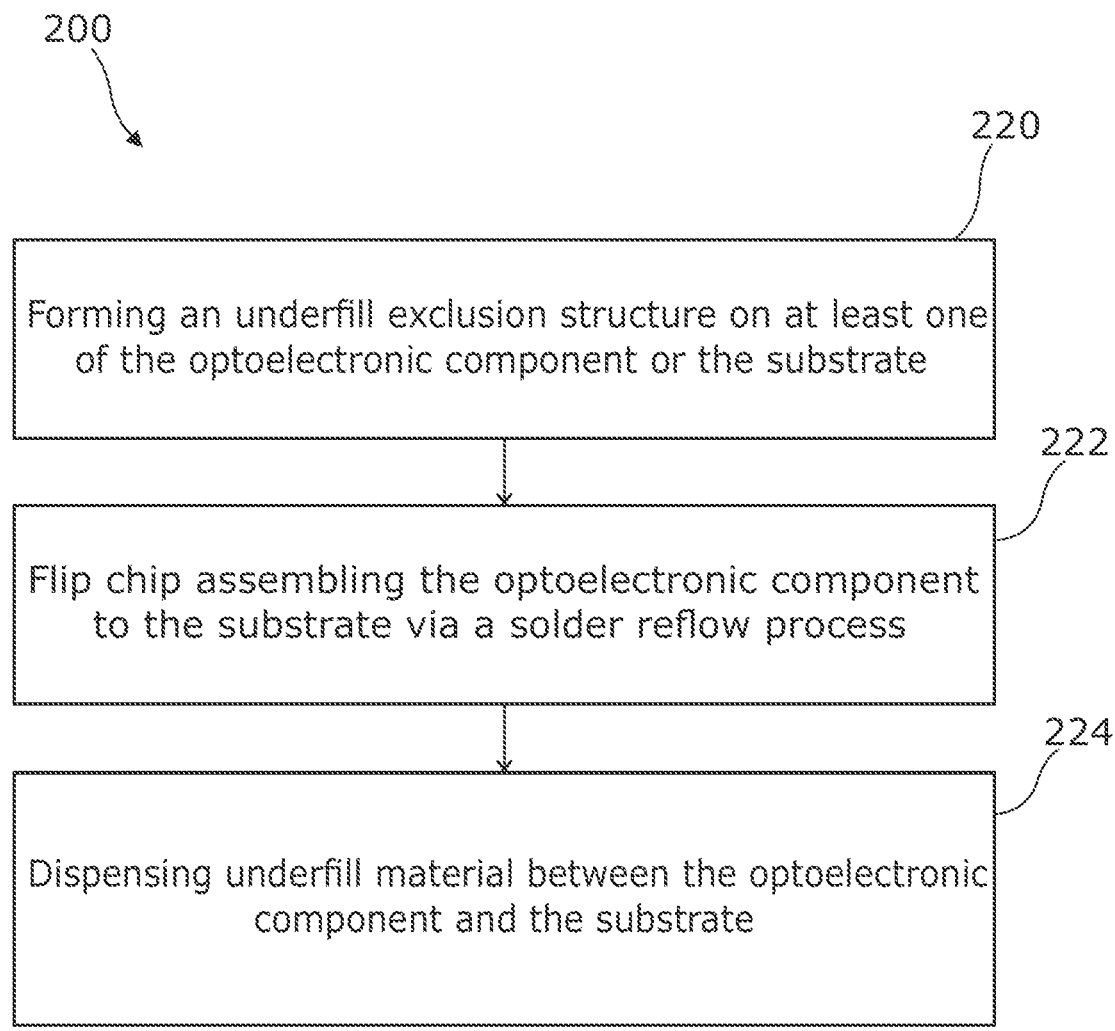
FIG. 2 is a flowchart schematically illustrating an example method of assembling an optoelectronic component to a substrate according to the present disclosure.

With reference to FIG. 2, an example method 200 of assembling an optoelectronic component to a substrate is described in accordance with the present disclosures. The method 200 includes the steps of forming an underfill exclusion structure on at least one of the optoelectronic component or the substrate 220. The underfill exclusion structure having a height such that the underfill exclusion structure is spaced apart from the at least one of the optoelectronic component or the substrate when the optoelectronic component is flip chip assembled to the substrate. The underfill exclusion structure is configured to prevent underfill material dispensed between the optoelectronic component and the substrate after the optoelectronic component is flip chip assembled to the substrate from flowing into a path of at least one optical signal between the optoelectronic component and the substrate. The method 200 includes flip chip assembling the optoelectronic component to the substrate via a solder reflow process 222. The method 200 further includes dispensing underfill material between the optoelectronic component and the substrate 224.

In the foregoing description, numerous details are set forth to provide an understanding of the subject disclosed herein. However, implementations may be practiced without some or all of these details. Other implementations may include additions, modifications, or variations from the details discussed above. It is intended that the appended claims cover such modifications and variations. The specification and drawings are, accordingly, to be regarded as illustrative rather than restrictive. Additionally, in the interest of clarity and to avoid unnecessarily obscuring the description, other details describing well-known structures and systems often associated with optoelectronic systems (e.g., traces between pads, driver circuitry), have not been set forth herein in the description of the various examples of the present disclosure.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect (e.g., having additional intervening components or elements), between two or more elements, nodes, or components; the coupling or connection between the elements can be physical, mechanical, logical, optical, electrical, or a combination thereof.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

The invention claimed is:

1. An optoelectronic system comprising:
a substrate having opposing first and second sides;
an optoelectronic component having opposing first and second sides, the optoelectronic component flip chip assembled to the first side of the substrate and configured to at least one of emit an optical signal to the substrate or receive an optical signal from the substrate; and
an underfill exclusion structure configured to prevent underfill material dispensed between the optoelectronic component and the substrate from flowing into a path of the optical signal, the underfill exclusion structure being spaced apart from at least one of the optoelectronic component or the substrate, wherein the underfill exclusion structure comprises a plurality of posts spaced from and extending around the path of the optical signal.

2. The optoelectronic system of claim 1, wherein the underfill exclusion structure is spaced apart from the optoelectronic component by a gap, the gap between the optoelectronic component and the underfill exclusion structure is sized such that the flow of the underfill material is prevented by capillary action between the gap and underfill material from flowing past the gap and into the path of the optical signal.

3. The optoelectronic system of claim 1, wherein the underfill exclusion structure is spaced apart from the substrate by a gap, the gap between the substrate and the underfill exclusion structure is sized such that the flow of the underfill material is prevented by capillary action between the gap and underfill material from flowing past the gap and into the path of the optical signal.

4. The optoelectronic system of claim 1, wherein the underfill exclusion structure extends from the substrate towards the optoelectronic component.

5. The optoelectronic system of claim 1, wherein the underfill exclusion structure extends from the optoelectronic component towards the substrate.

6. The optoelectronic system of claim 1, wherein the underfill exclusion structure comprises a first portion and a second portion spaced apart by a gap, the first portion extending from the substrate towards the optoelectronic component and the second portion extending from the optoelectronic component towards the substrate, wherein the gap between the first and second portions is sized such that the flow of the underfill material is prevented by capillary action between the gap and underfill material from flowing past the gap and into the path of the optical signal.

7. The optoelectronic system of claim 1, wherein the plurality of posts extend around the path of the optical signal in a circular or rectangular configuration.

8. The optoelectronic system of claim 1, wherein two or more optical signals are transmitted between the optoelectronic component and the substrate and the underfill exclusion structure is configured to prevent underfill material
   dispensed between the optoelectronic component and the substrate from flowing into paths of the two or more optical signals.

9. The optoelectronic system of claim 1, further comprising a plurality of pillars coupling the first side of the substrate and the optoelectronic component to flip-chip assemble the optoelectronic component to the substrate.

10. An optoelectronic device comprising:
    an optoelectronic component having opposing first and second sides, the optoelectronic component configured to be flip chip assembled to a substrate and configured to at least one of emit an optical signal to the substrate or receive an optical signal from the substrate; and
    an underfill exclusion structure extending from the optoelectronic component and configured to be spaced apart from the substrate when the optoelectronic component is flip chip assembled to the substrate, the underfill exclusion structure configured to prevent underfill material dispensed between the optoelectronic component and the substrate after the optoelectronic component is flip chip assembled to the substrate from flowing into a path of the optical signal, wherein the underfill exclusion structure comprises a plurality of posts spaced from and extending around the path of the optical signal.

11. The optoelectronic device of claim 10, wherein the underfill exclusion structure is spaced apart from the substrate by a gap when the optoelectronic component is flip chip assembled to the substrate, the gap sized such that flow of the underfill material dispensed between the optoelectronic component and the substrate after the optoelectronic component is flip chip assembled to the substrate is prevented by capillary action between the gap and underfill material from flowing past the gap and into the path of the optical signal.

12. The optoelectronic device of claim 11, further comprising a plurality of pillars extending from the optoelectronic component configured to be soldered to the substrate to flip-chip assemble the optoelectronic component to the substrate.

\* \* \* \* \*